(12) United States Patent
El-Sobky et al.

(10) Patent No.: US 12,332,197 B2
(45) Date of Patent: Jun. 17, 2025

(54) SYSTEMS AND METHODS FOR DETERMINING SURFACTANT IMPACT ON RESERVOIR WETTABILITY

(71) Applicant: ConocoPhillips Company, Houston, TX (US)

(72) Inventors: Hesham F. El-Sobky, Houston, TX (US); Ronald J. M. Bonnie, Houston, TX (US); Tianmin Jiang, Houston, TX (US)

(73) Assignee: ConocoPhillips Company, Houston, TX (US)

( * ) Notice: Subject to any disclaimer, the term of this patent is extended or adjusted under 35 U.S.C. 154(b) by 281 days.

(21) Appl. No.: 17/988,517

(22) Filed: Nov. 16, 2022

(65) Prior Publication Data

US 2023/0152255 A1 May 18, 2023

Related U.S. Application Data

(60) Provisional application No. 63/279,807, filed on Nov. 16, 2021.

(51) Int. Cl.
*G01N 24/08* (2006.01)
*G01V 3/32* (2006.01)

(52) U.S. Cl.
CPC ............. *G01N 24/081* (2013.01); *G01V 3/32* (2013.01)

(58) Field of Classification Search
CPC .............................. G01V 3/32; G01N 24/081
See application file for complete search history.

(56) References Cited

U.S. PATENT DOCUMENTS

| | | | |
|---|---|---|---|
| 7,716,028 B2 * | 5/2010 | Montaron | G06F 30/23 |
| | | | 702/6 |
| 7,755,354 B2 | 7/2010 | Akkurt | |
| 9,575,203 B2 | 2/2017 | Chen et al. | |
| 9,874,619 B2 | 1/2018 | Green | |
| 10,113,946 B2 * | 10/2018 | Wickramathilaka | G01N 13/02 |
| 10,197,489 B2 * | 2/2019 | McCarty | G01N 33/24 |
| 10,634,746 B2 | 4/2020 | Wang et al. | |

(Continued)

FOREIGN PATENT DOCUMENTS

| | | |
|---|---|---|
| WO | WO-2019079784 A1 | 4/2019 |
| WO | WO-2019199304 A1 | 10/2019 |

*Primary Examiner* — Gregory H Curran
(74) *Attorney, Agent, or Firm* — Polsinelli PC

(57) ABSTRACT

Implementations described and claimed herein provide systems and methods for determining surfactant impact on reservoir wettability. In one implementation, a nuclear magnetic resonance T1 measurement of a sample is obtained before surfactant imbibition is applied to the sample, and a second nuclear magnetic T2 measurement of the sample is made after forced imbibition of the surfactant. Moreover, another nuclear magnetic resonance T1 measurement (e.g., omitting surfactant imbibition) can be obtained simultaneously with the nuclear magnetic resonance T2 measurement using a twin core sample. The nuclear magnetic resonance T1 measurement and the nuclear magnetic resonance T2 measurement are captured under simulated reservoir conditions. A fluid typing map is generated using the nuclear magnetic resonance T1 measurement and the nuclear magnetic resonance T2 measurement. An impact of the surfactant on fluid producibility is determined based on the fluid typing map.

19 Claims, 6 Drawing Sheets

(56) References Cited

U.S. PATENT DOCUMENTS

| | | |
|---|---|---|
| 10,718,701 B2 | 7/2020 | Cao et al. |
| 11,131,186 B1 | 9/2021 | Al-Garadi et al. |
| 2012/0241149 A1 | 9/2012 | Chen et al. |

* cited by examiner

SYSTEMS AND METHODS FOR DETERMINING SURFACTANT IMPACT ON RESERVOIR WETTABILITY

CROSS-REFERENCE TO RELATED APPLICATIONS

The present application claims priority to U.S. Provisional Application No. 63/279,807 filed on Nov. 16, 2021, which is incorporated by reference in its entirety herein.

FIELD

Aspects of the present disclosure relate generally to systems and methods for determining surfactant impact on reservoir wettability and more particularly to selecting a surfactant for an unconventional reservoir based on nuclear magnetic resonance ("NMR") measurements and flow though experiments.

BACKGROUND

An understanding of wettability of a reservoir, such as an oil shale reservoir, may be used to optimize production of wells in the reservoir. Wettability generally refers to a tendency of a fluid to be in contact with a solid in a presence of other immiscible fluids. In wellbore drilling, fluid phases may be hydrocarbons, water, and/or the like with solids including minerals forming rock in the reservoir. Thus, wettability may correspond to the relative tendency of a rock to be covered by a certain phase, such as water or oil. The wettability of reservoir rocks affects the hydrocarbon distribution within the reservoir and dynamic behavior of the reservoir, as well as hydrocarbon recovery, among other aspects of production. Understanding surfactant impact on wettability of the reservoir and estimating potential hydrocarbon and water cut increase or decrease as a function of surfactant is challenging. There are currently no direct tests for unconventional reservoirs that provide a dynamic workflow and direct impact on fluid producibility. However, understanding the impact of surfactants and selecting an optimal surfactant will increase oil production and reduce water cut. It is with these observations in mind, among others, that various aspects of the present disclosure were conceived and developed.

SUMMARY

Implementations described and claimed herein address the foregoing by providing systems and methods for determining surfactant impact on reservoir wettability. In one implementation, a nuclear magnetic resonance T1 measurement of a sample imbibed with a surfactant is obtained and this measurement can be repeated at multiple time-steps after aging the rock at high pressure high temperature (HPHT) conditions. The nuclear magnetic resonance T1 measurement is captured under simulated reservoir conditions. A nuclear magnetic resonance T2 measurement of the same sample is obtained. A fluid typing map is generated using the nuclear magnetic resonance T1 measurement and the nuclear magnetic resonance T2 measurement for all time-steps. An impact of the surfactant on fluid producibility is determined based on the fluid typing maps difference.

In some examples, a method to determine surfactant impact on reservoir wettability comprises: obtaining a nuclear magnetic resonance T1 measurement of a sample, the nuclear magnetic resonance T1 measurement being captured under simulated reservoir conditions; obtaining a nuclear magnetic resonance T2 measurement of the sample upon imbibing the sample with surfactant, the nuclear magnetic resonance T2 measurement being captured under the simulated reservoir conditions; generating a fluid typing map using the nuclear magnetic resonance T1 measurement and the nuclear magnetic resonance T2 measurement; and determining an impact of the surfactant on fluid producibility based on the fluid typing map difference.

Other implementations are also described and recited herein. Further, while multiple implementations are disclosed, still other implementations of the presently disclosed technology will become apparent to those skilled in the art from the following detailed description, which shows and describes illustrative implementations of the presently disclosed technology. As will be realized, the presently disclosed technology is capable of modifications in various aspects, all without departing from the spirit and scope of the presently disclosed technology. Accordingly, the drawings and detailed description are to be regarded as illustrative in nature and not limiting.

DETAILED DESCRIPTION

Figure 1:
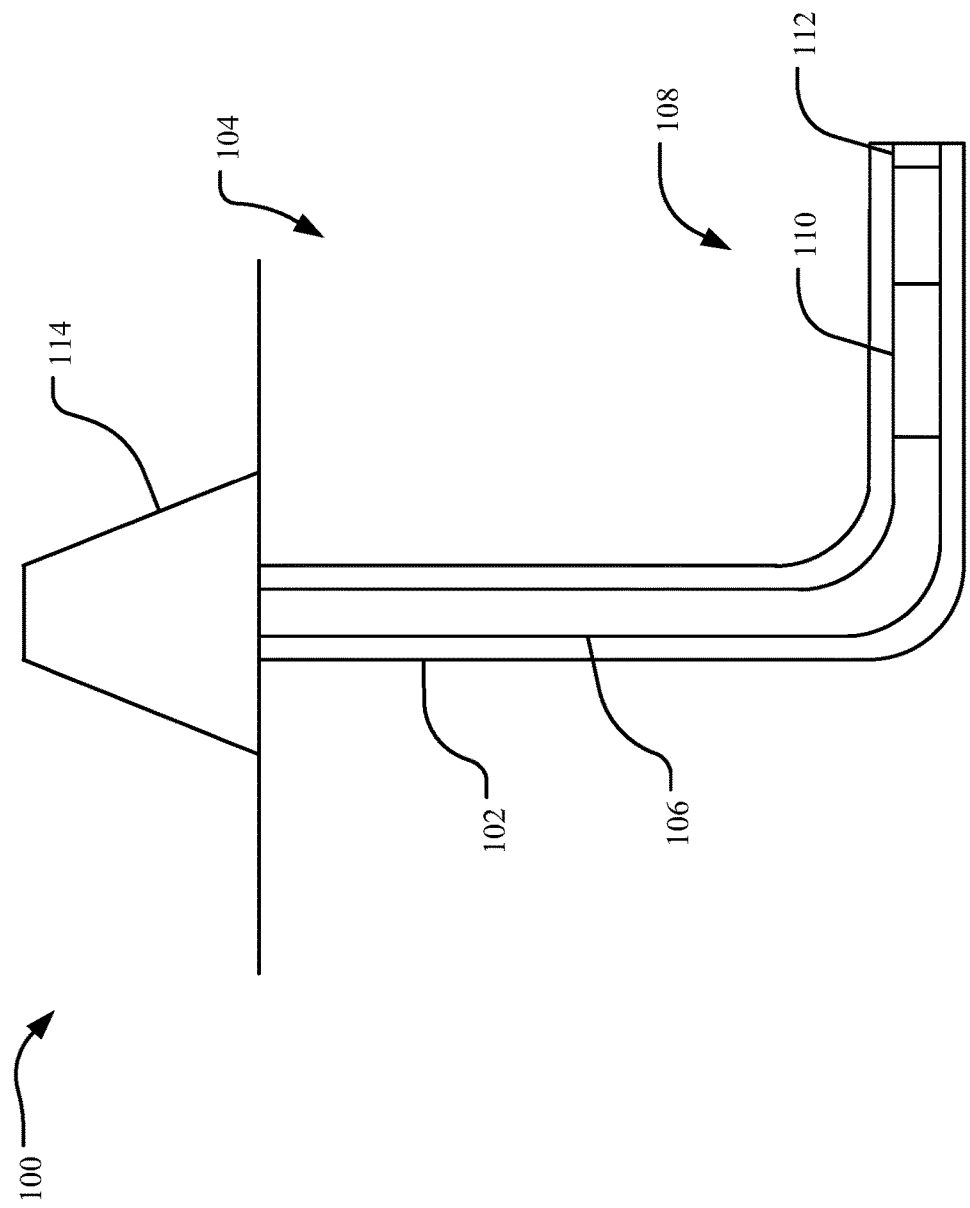
FIG. 1 depicts an example system for developing a reservoir.

Aspects of the present disclosure provide an understanding of surfactant impact on wettability of reservoirs, such as unconventional and/or oil shale reservoirs, for predicting hydrocarbon and water cut change as a function of scaled surfactant. In one aspect, a fluid typing map for a reservoir is generated, and producible and non-producible hydrocarbons and water are differentiated between using the fluid typing map, for example as a function of wettability or interfacial tension changes.

For instance, a nuclear magnetic resonance (NMR) measurement can be captured for a sample plug at first time, T1, before undergoing forced imbibition with surfactant, and for the same sample plug a second time, T2, after undergoing forced imbibition with surfactant to create one or more aging time-steps. In addition to the separate, sequential T1 and T2 measurements for the sample plug, simultaneous T1 and T2 can be measured for the sample plug undergoing the forced imbibition with the surfactant by using a twin sample plug (e.g., a second sample plug) omitting the forced imbibition throughout the process to provide simultaneous T1 measurements. The NMR measurements can be performed under simulated reservoir conditions for the T1 and T2 measurements both separately and simultaneously. The NMR measurements can be performed over the entire sample plug(s) and every 2 mm to generate a high-resolution saturation profile of the plug(s) for both brine and oil saturation (e.g., for both base line and forced imbibition scenarios). The presently disclosed technology provides a direct test for unconventional reservoirs that has a dynamic workflow and direct impact on fluid producibility, among other benefits.

I. TERMINOLOGY

As used herein, the terms "comprises," "comprising," "includes," "including," "has," "having" or any other variation thereof, are intended to cover a non-exclusive inclusion. For example, a process, product, article, or apparatus that comprises a list of elements is not necessarily limited only those elements but can include other elements not expressly listed or inherent to such process, process, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

The term substantially, as used herein, is defined to be essentially conforming to the particular dimension, shape or other word that substantially modifies, such that it need not be exact. For example, substantially cylindrical means that the object resembles a cylinder, but can have one or more deviations from a true cylinder.

Additionally, any examples or illustrations given herein are not to be regarded in any way as restrictions on, limits to, or express definitions of, any term or terms with which they are utilized. Instead these examples or illustrations are to be regarded as being described with respect to one particular example and as illustrative only. Those of ordinary skill in the art will appreciate that any term or terms with which these examples or illustrations are utilized encompass other examples as well as implementations and adaptations thereof which can or cannot be given therewith or elsewhere in the specification and all such examples are intended to be included within the scope of that term or terms. Language designating such non-limiting examples and illustrations includes, but is not limited to: "for example," "for instance," "e.g.," "in some examples," "in one implementation," and the like.

Although the terms first, second, etc. can be used herein to describe various elements, components, regions, layers, sections, and/or other features, these features should not be limited by these terms. These terms are only used to distinguish one feature from another. Thus, a first feature discussed below could be termed a second feature or otherwise without departing from the presently disclosed technology.

II. GENERAL ARCHITECTURE AND OPERATIONS

Generally, the systems and methods described herein guide selection of surfactant types and concentrations upscaling to field for economic evaluations through direct measurements in simulated reservoir conditions. As such, the presently disclosed technology provides a direct test for unconventional reservoirs that differentiates between producible and non-producible fluid types.

To begin a detailed description of an example system 100 to develop a reservoir (e.g., a reservoir development system), reference is made to FIG. 1. In one implementation, the system 100 includes a wellbore 102 formed in a subterranean formation 104 of a reservoir, such as an unconventional reservoir, an oil shale reservoir, and/or the like.

The wellbore 102 may involve a production tube. In some instances, the production tube may be deployed in a casing with cement filling an annulus formed between the casing and the subterranean formation 104, thus securing the casing within the wellbore 102. The production tube may be used in connection with the extraction of hydrocarbons from the subterranean formation 104 in the reservoir. While FIG. 1 illustrates the wellbore 102 having a substantially vertical portion and a substantially horizontal portion, it will be appreciated that the wellbore 102 may be any wellbore arrangement having any number of vertical portions, horizontal portions, and/or any angle therebetween. Further, while FIG. 1 illustrates a land-based operation, it will be appreciated that the wellbore 102 may correspond to land-based and/or sea-based operations.

In one implementation, a drill string 106 may extend into the wellbore 102 and include a bottom hole assembly 108. The bottom hole assembly 108 may include a variety of downhole tools, such as a drill bit 112, a nuclear magnetic resonance (NMR) measurement tool 110, and/or other steering tools, drilling tools, logging tools, measurement tools, and/or the like. The NMR tool 110 may be used to obtain data regarding fluids within a porous medium. For example, the NMR tool 110 may obtain data for use in determining wettability of fluids in reservoir rocks without interfering with fluid distribution within the rock. The techniques disclosed herein can be integrated with wireline logging and are not restricted to logging while drilling (LWD) measurements.

The NMR measurement tool 110 provides NMR spectroscopy that may be used to understand fluids containing water and hydrocarbon phases within a porous medium. More particularly, when an assembly of magnetic moments are exposed to a magnetic field, bulk magnetization results with the magnetic moments aligning along the direction of the magnetic field. NMR spectroscopy may be used to measure the spin-lattice relaxation time (T1) and/or the spin-spin relaxation time (T2) of the fluid. The rate at which equilibrium is established in the bulk magnetization may be characterized by the NMR T1 measurement, and the NMR T2 measurement is an expression of the relaxation due to non-homogeneities in the local magnetic field over a sensing volume.

In one implementation, the NMR measurement tool 110 is a laboratory-based tool that is utilized in connection with a formation core sample from the reservoir formation 104. The NMR measurement tool 110 captures high resolution and high frequency NMR T1 and T2 measurements under simulated reservoir conditions. The simulated reservoir conditions mirror the conditions of the reservoir formation 104. For example, the simulated reservoir conditions may include a simulated temperature (e.g., 250° F. or higher) and a simulated pressure (e.g., 5000 psi or higher). Various surfactants or blend of surfactants may be tested in the sample to determine the impact of the surfactant on both reservoir wettability and/or interfacial tension changes. More particularly, the high resolution and spatial T1 and T2 measurements may be used to generate a fluid typing map for differentiating between producible and non-producible hydrocarbons and water as a function of wettability or interfacial tension changes. The NMR T1 and T2 measurements may be captured simultaneously under the simulated reservoir conditions after applying enforced imbibition to the sample with different surfactants and tracers. Preserved samples are used for capturing base-line measurements without a surfactant in both T1 and T2 measurements before and after aging the oil-saturated rock to ensure a high chance of 100% oil-wet condition. For instance, a twin core of the sample (e.g., a second sample) can be created so that T1 measurements can continue to be taken on the second sample simultaneously with the T2 sample throughout the process. Surfactants may then be tested relative to the base-line measurements, thereby providing a direct measurement for selecting a surfactant type and/or surfactant concentration upscaling to field for economical evaluations.

Understanding the impact of surfactants and selecting an optimal surfactant improves reservoir production through increased oil production and reduced water cut. Additionally, it may optimize parent wells through pumping into parents (Pip's) to retrieve production level prior to shut down. Insights into the soaking time needed before production to optimize surfactant impact may also be provided, among other advantages.

Figure 2A:
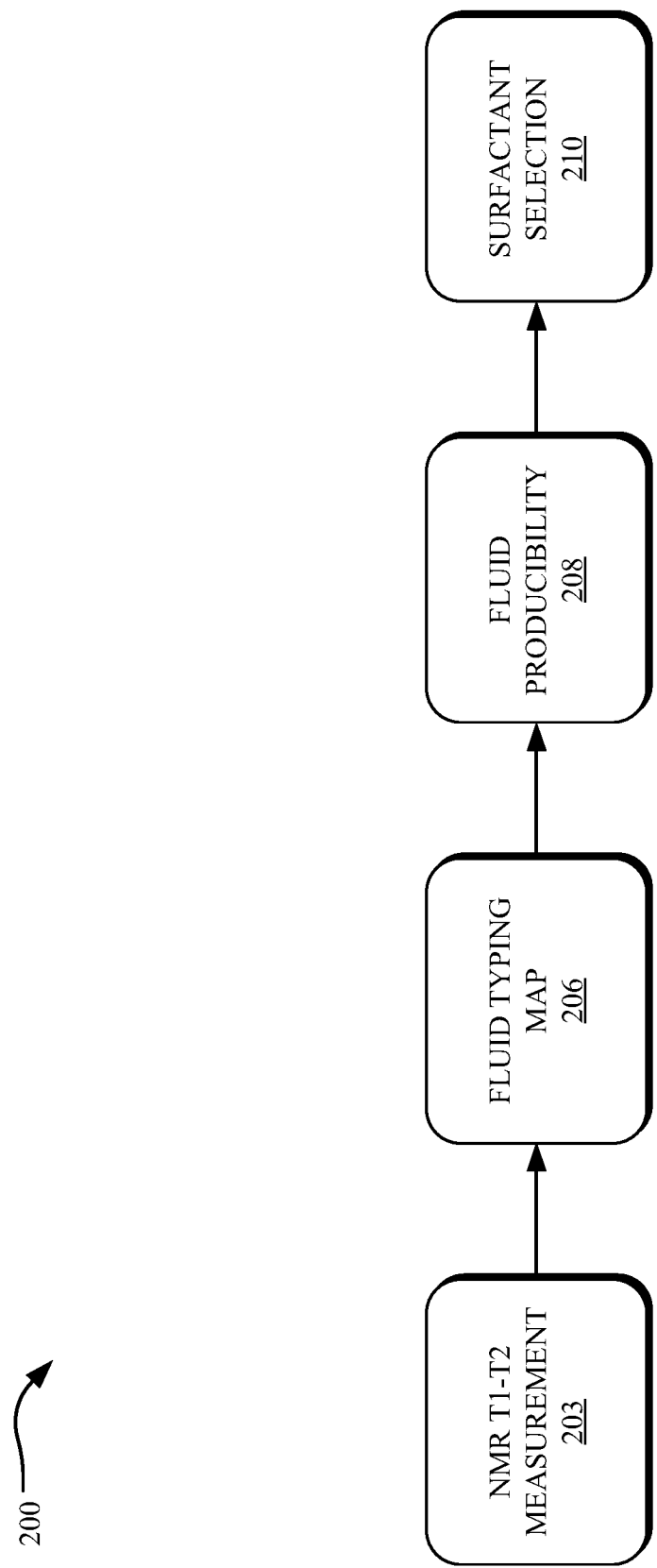
FIGS. 2A and 2B depict example methods including testing workflows for understanding the impact of surfactants.
Figure 2B:
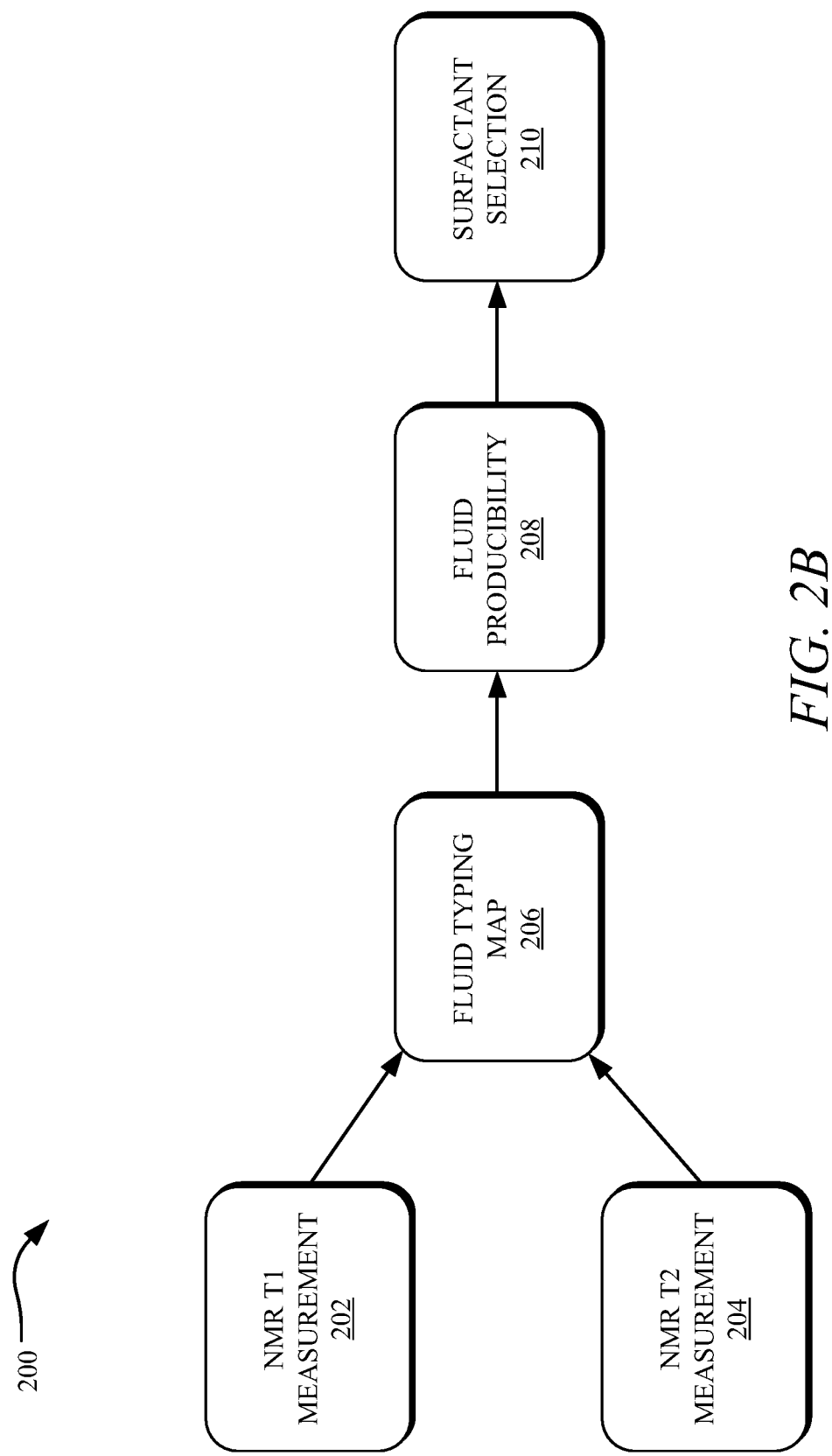

Turning to FIGS. 2A and 2B, example testing workflows 200 for understanding the impact of surfactants are depicted, which can be performed with the system 100 (e.g., using the computing system 500 discussed below regarding FIG. 5). FIG. 2A depicts an embodiment of the testing workflow 200 that includes a simultaneous NMR measurement 203 of T1 and T2 (e.g., using two core samples to provide the T1 and T2 measurements). The simultaneous NMR measurement 203 can use similar techniques as NMR T1 measurement 202 and NMR T2 measurement 204, discussed below. FIG. 2B depicts an embodiment of the testing workflow 200, which can be performed simultaneously and/or concurrently with the embodiment of FIG. 2A.

For instance, turning to FIG. 2B, in one implementation, a NMR T1 measurement 202 and a NMR T2 measurement 204 are conducted on a sample at simulated reservoir conditions. For example, the NMR measurements 202-204 may be captured at a temperature of 250° F. or greater and a pressure of approximately 5000 psi or greater. The NMR measurements 202-204 may be high frequency or low frequency. For example, the sample may be tested at 2 MHz and 8 MHz or higher frequency. The method is not limited to any particular frequency and can be utilized with any NMR spectrometer operating at any frequency. The sample may be imbibed with frac fluid first without any surfactants, with time lapse (TL) effluent being collected at a predetermined frequency (e.g., every week or less) with date and time monitoring to study the compositional change as a function of time as a Time Lapse Geochemistry (TLG). The sample may be aged a predetermined amount of time (e.g., at least a month) at a predetermined temperature (e.g., 320° F.) and the NMR measurements 202-204 may be recaptured for comparison to baseline measurements.

A first sample corresponding to the baseline measurements may be forced imbibed with brine (low total dissolved solids (TDS)) at high temperature and high pressure. TL effluent is collected and the NMR measurements 202-204 are captured under simulated reservoir conditions (e.g., 4000 psi and 250° F.) for both plug and effluent. A second sample is similarly forced imbibed with brine (low TDS) at high temperature and high pressure. The frac fluids for the second sample may be imbibed with a first surfactant with the sample being aged at the predetermined temperature (e.g., 320° F.) for the predetermined amount of time (e.g., one month) and the NMR measurements 202-204 recaptured. TL effluent is collected and the NMR measurements 202-204 are captured under simulated reservoir conditions (e.g., 4000 psi and 250° F.). Special design is required to avoid downstream contamination of the effluent, where fluorinert might be used for back pressure regulation.

The first sample may be forced imbibed with reservoir oil (e.g., a representative oil of the reservoir) at HTHP above Wax Appearance Temperature (WAT). TL effluent is collected and the NMR measurements 202-204 are captured under simulated reservoir conditions (e.g., 4000 psi and 250° F.). Various parameters may be measured, such as mercury injection capillary pressure (MICP), total porosity (ΦT), and permeability (absolute and SSK). As such, based on the NMR measurements 202-204 a fluid typing map 206 for the first sample may be generated. The second sample is similarly imbibed with reservoir oil at high temperature and high pressure but also with a first tracer having an affinity to oil. TL effluent is collected at a predetermined frequency (e.g., weekly) until the first tracer is recognized. The NMR measurements 202-204 are captured under simulated reservoir conditions (e.g., 4000 psi and 250° F.) and the tracers are x-rayed. The second sample is forced imbibed with water at high temperature and high pressure. The frac fluids are imbibed with optimized TDS and a second tracer having an affinity for water. TL effluent is collected at a predetermined frequency (e.g., weekly) until the second tracer is recognized. The NMR measurements 202-204 are captured under simulated reservoir conditions (e.g., 4000 psi and 250° F.) and the tracers are x-rayed. Various parameters may be measured, such as mercury injection capillary pressure (MICP), total porosity (ΦT), and permeability (K). As such, based on the NMR measurements 202-204 the fluid typing map 206 for the second sample may be generated. Using the fluid typing map(s) 206, fluid producibility 208 may be determined. The fluid producibility 208 differentiates between producible and non-producible hydrocarbons and water as a function of wettability or interfacial tension changes. By comparing the baseline of the fluid producibility 208 for the first sample, with the fluid producibility 208 of the second sample, surfactant selection 210 may be determined, such that a surfactant type and/or surfactant concentration may be selected for upscaling to field for economical evaluations. Effluent advanced analysis to determine both surfactant types and concentrations is crucial step to understand both adsorption and stability of surfactant blends after exposure to HPHT conditions prior to field trials.

Figure 3:
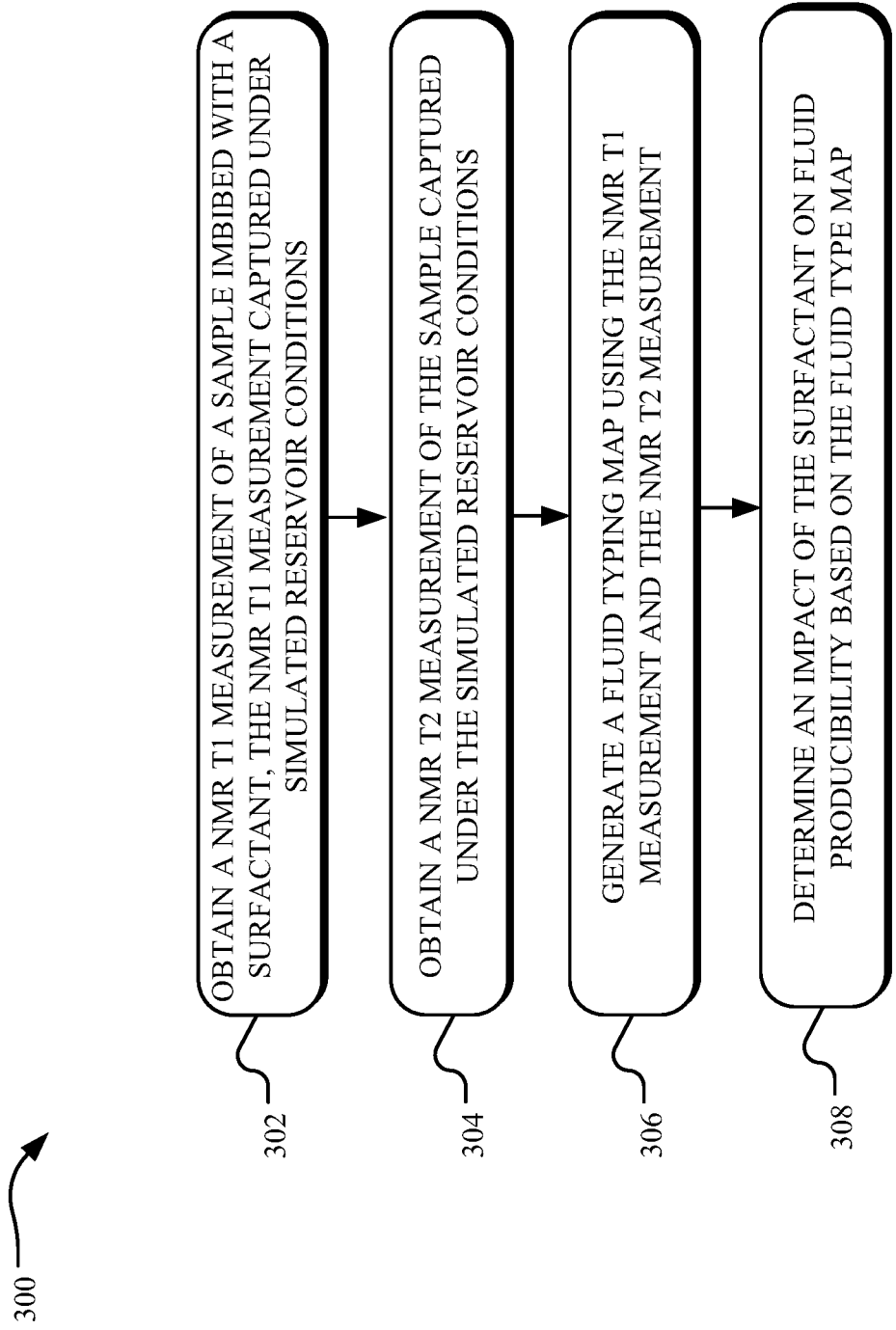
FIG. 3 depicts an example method to determine surfactant impact on reservoir wettability.

Turning to FIG. 3, example operations 300 of a method to determine surfactant impact on reservoir wettability are illustrated, which can be performed with the system 100 (e.g., using the computing system 500 discussed below regarding FIG. 5). In one implementation, an operation 302 obtains a NMR T1 measurement of a sample imbibed with a surfactant. The NMR T1 measurement is captured under simulated reservoir conditions. An operation 304 obtains a NMR T2 measurement of the sample. The NMR T2 measurement is captured under the simulated reservoir conditions. The simulated reservoir conditions may include a high temperature and a high pressure. For example, the high temperature may be approximately 250° F. and the high pressure may be approximately 5000 psi. In one implementation, the sample is aged for a predetermined period of time at a predetermined temperature following the sample being imbibed with the surfactant and prior to the NMR T1 measurement and the NMR T2 measurement being measured. For example, the predetermined period of time may be approximately two months and the predetermined temperature may be approximately 320° F.

An operation 306 generates a fluid typing map using the simultaneous NMR T1 measurement and the NMR T2 measurements. An operation 308 determines an impact of the surfactant on fluid producibility based on the fluid typing map. The fluid producibility may include hydrocarbons and water producibility. The impact of the surfactant on the fluid producibility may be determined based on a differentiation between producible and non-producible hydrocarbon and water as a function of wettability or interfacial tension changes. The fluid typing map may provide the differentiation between the producible and non-producible hydrocarbon and water. In one example, the impact of the surfactant on the fluid producibility is determined based on oil production and water cut. The surfactant may be selected for a reservoir from a plurality of surfactants based on the impact of the surfactant on the fluid producibility. In one example, the reservoir is an unconventional reservoir. A concentration of the surfactant may be selected based on the impact of the surfactant on the fluid producibility. In some examples, the sample is imbibed with a tracer. The tracer may have an affinity to water or oil.

Figure 4:
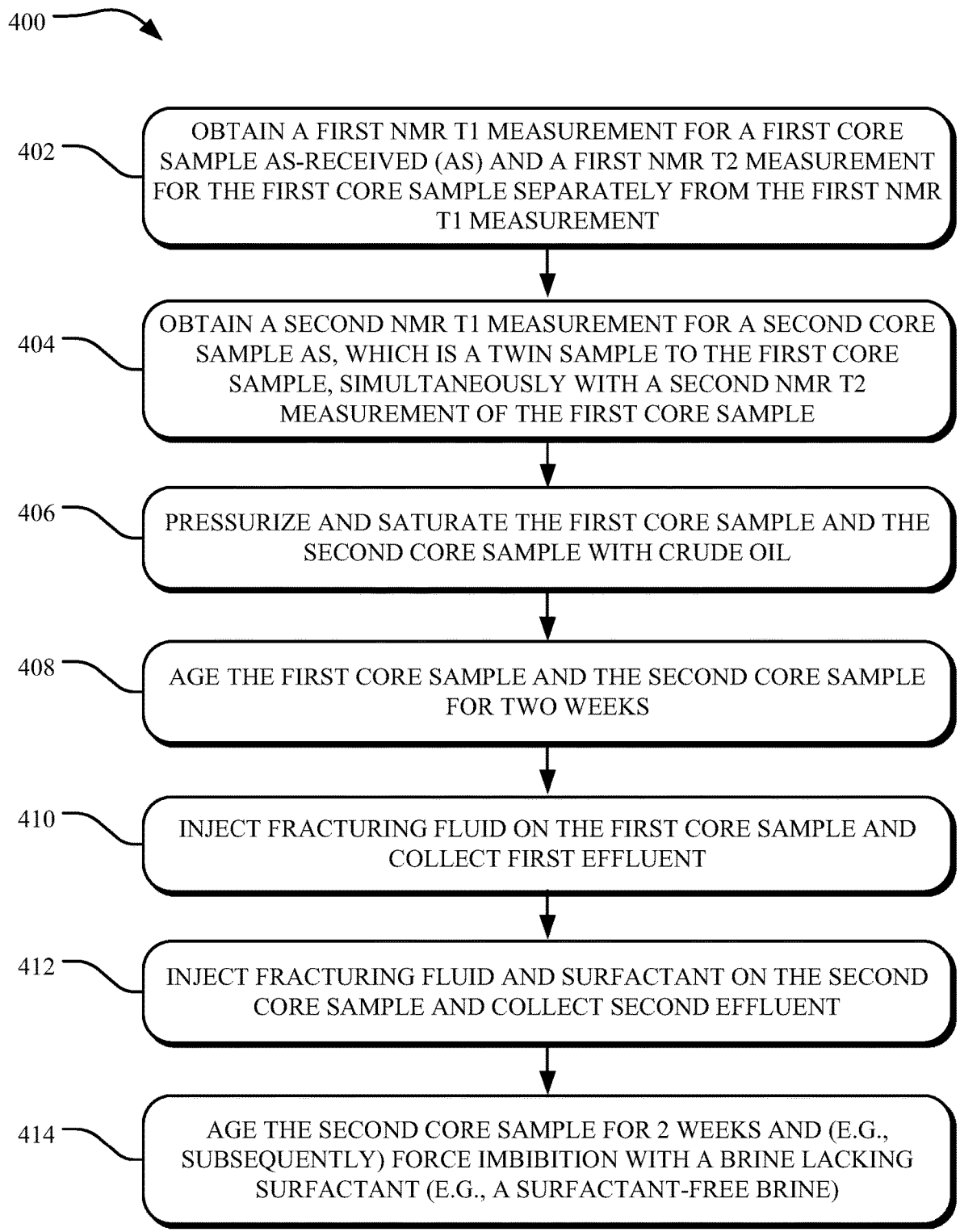
FIG. 4 depicts an example method to determine surfactant impact on reservoir wettability using twin core samples.

Turning to FIG. 4, an example method 400 to determine surfactant impact on reservoir wettability using twin core samples is depicted, which can be performed with the system 100 (e.g., using the computing system 500 discussed below regarding FIG. 5).

At operation 402, the method 400 can obtain a first NMR T1 measurement for a first core sample as-received (AS) and a first NMR T2 measurement for the first core sample separately from the first NMR T1 measurement. At operation 404, the method 400 can obtain a second NMR T1 measurement for a second core sample AS, which is a twin sample to the first core sample, simultaneously with a second NMR T2 measurement of the first core sample. At operation 406, the method 400 can pressurize and saturate the first core sample and the second core sample with crude oil. Following operation 406, operations 402 and 404 can be performed and/or repeated. At operation 408, the method 400 can age the first core sample and the second core sample for two weeks. Following operation 408, operations 402 and 404 can be performed and/or repeated. At operation 410, the method 400 can inject fracturing fluid on the first core sample and collect first effluent. At operation 412, the method 400 can inject fracturing fluid and surfactant on the second core sample and collect second effluent. Operation 412 can be performed concurrently with operation 410, and operations 402 and 404 can be performed and/or repeated following operations 412 and/or 410. At operation 414, the method 400 can age the second core sample for 2 weeks and (e.g., subsequently) force imbibition with a brine lacking surfactant (e.g., a surfactant-free brine). Following operation 414, operations 402 and 404 can be performed and/or repeated.

Figure 5:
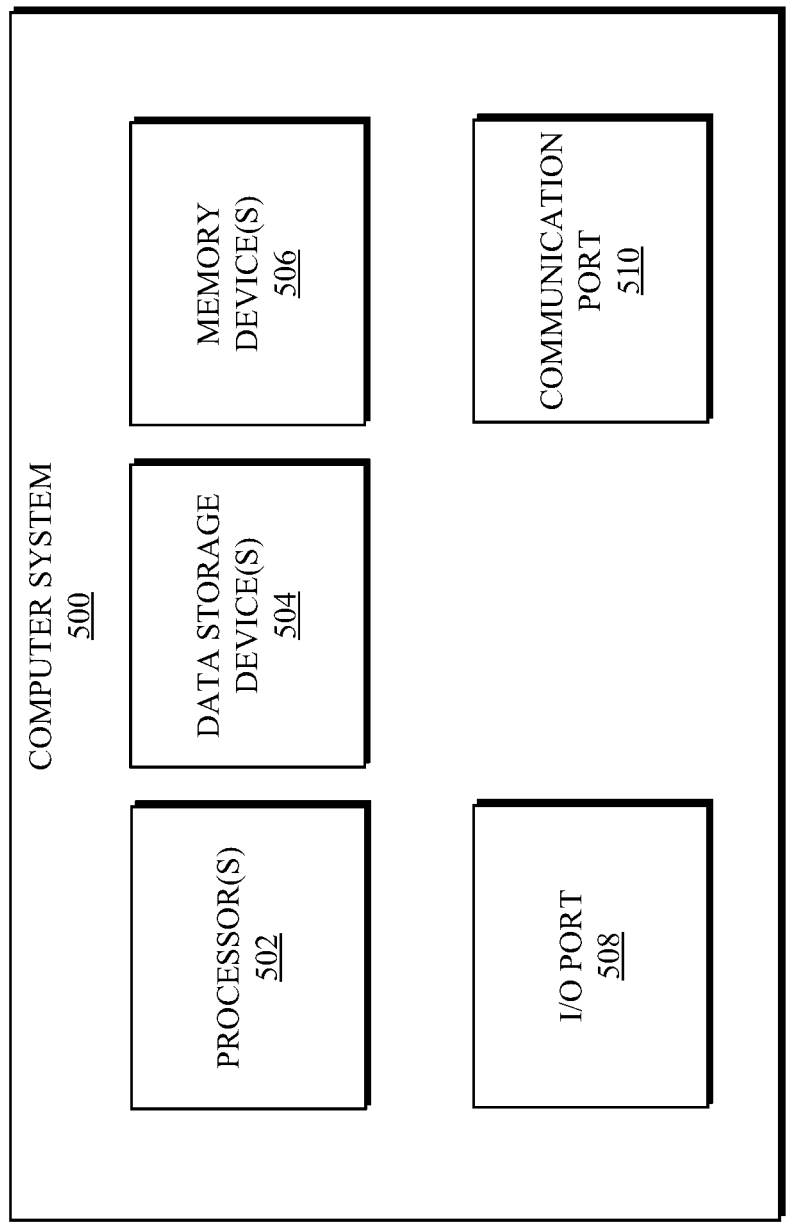
FIG. 5 depicts an example computing system that can implement the systems and methods discussed herein.

Referring to FIG. 5, a detailed description of an example computing system 500 having one or more computing units that may implement various systems and methods discussed herein is provided. The computing system 500 may be applicable to the development prediction system 102, the system 100, and other computing or network devices. It will be appreciated that specific implementations of these devices may be of differing possible specific computing architectures not all of which are specifically discussed herein but will be understood by those of ordinary skill in the art.

The computer system 500 may be a computing system capable of executing a computer program product to execute a computer process. Data and program files may be input to the computer system 500, which reads the files and executes the programs therein. Some of the elements of the computer system 500 are shown in FIG. 5, including one or more hardware processors 502, one or more data storage devices 504, one or more memory devices 506, and/or one or more ports 508-510. Additionally, other elements that will be recognized by those skilled in the art may be included in the computing system 500 but are not explicitly depicted in FIG. 5 or discussed further herein. Various elements of the computer system 500 may communicate with one another by way of one or more communication buses, point-to-point communication paths, or other communication means not explicitly depicted in FIG. 5.

The processor 502 may include, for example, a central processing unit (CPU), a microprocessor, a microcontroller, a digital signal processor (DSP), and/or one or more internal levels of cache. There may be one or more processors 502, such that the processor 502 comprises a single central-processing unit, or a plurality of processing units capable of executing instructions and performing operations in parallel with each other, commonly referred to as a parallel processing environment.

The computer system 500 may be a conventional computer, a distributed computer, or any other type of computer, such as one or more external computers made available via a cloud computing architecture. The presently described technology is optionally implemented in software stored on the data stored device(s) 504, stored on the memory device(s) 506, and/or communicated via one or more of the ports 508-510, thereby transforming the computer system 500 in FIG. 5 to a special purpose machine for implementing the operations described herein. Examples of the computer system 500 include personal computers, terminals, workstations, mobile phones, tablets, laptops, personal computers, multimedia consoles, gaming consoles, set top boxes, and the like.

The one or more data storage devices 504 may include any non-volatile data storage device capable of storing data generated or employed within the computing system 500, such as computer executable instructions for performing a computer process, which may include instructions of both application programs and an operating system (OS) that manages the various components of the computing system 500. The data storage devices 504 may include, without limitation, magnetic disk drives, optical disk drives, solid state drives (SSDs), flash drives, and the like. The data storage devices 504 may include removable data storage media, non-removable data storage media, and/or external storage devices made available via a wired or wireless network architecture with such computer program products, including one or more database management products, web server products, application server products, and/or other additional software components. Examples of removable data storage media include Compact Disc Read-Only Memory (CD-ROM), Digital Versatile Disc Read-Only Memory (DVD-ROM), magneto-optical disks, flash drives, and the like. Examples of non-removable data storage media include internal magnetic hard disks, SSDs, and the like. The one or more memory devices 506 may include volatile memory (e.g., dynamic random-access memory (DRAM), static random access memory (SRAM), etc.) and/or non-volatile memory (e.g., read-only memory (ROM), flash memory, etc.).

Computer program products containing mechanisms to effectuate the systems and methods in accordance with the presently described technology may reside in the data storage devices 504 and/or the memory devices 506, which may be referred to as machine-readable media. It will be appreciated that machine-readable media may include any tangible non-transitory medium that is capable of storing or encoding instructions to perform any one or more of the operations of the present disclosure for execution by a machine or that is capable of storing or encoding data structures and/or modules utilized by or associated with such instructions. Machine-readable media may include a single medium or multiple media (e.g., a centralized or distributed database, and/or associated caches and servers) that store the one or more executable instructions or data structures.

In some implementations, the computer system 500 includes one or more ports, such as an input/output (I/O) port 508 and a communication port 510, for communicating with other computing, network, or reservoir development devices. It will be appreciated that the ports 508-510 may be combined or separate and that more or fewer ports may be included in the computer system 500.

The I/O port 508 may be connected to an I/O device, or other device, by which information is input to or output from the computing system 500. Such I/O devices may include, without limitation, one or more input devices, output devices, and/or environment transducer devices.

In one implementation, the input devices convert a human-generated signal, such as, human voice, physical movement, physical touch or pressure, and/or the like, into electrical signals as input data into the computing system 500 via the I/O port 508. Similarly, the output devices may convert electrical signals received from computing system 500 via the I/O port 508 into signals that may be sensed as output by a human, such as sound, light, and/or touch. The input device may be an alphanumeric input device, including alphanumeric and other keys for communicating information and/or command selections to the processor 502 via the I/O port 508. The input device may be another type of user input device including, but not limited to: direction and selection control devices, such as a mouse, a trackball, cursor direction keys, a joystick, and/or a wheel; one or more sensors, such as a camera, a microphone, a positional sensor, an orientation sensor, a gravitational sensor, an inertial sensor, and/or an accelerometer; and/or a touch-sensitive display screen ("touchscreen"). The output devices may include, without limitation, a display, a touchscreen, a speaker, a tactile and/or haptic output device, and/or the like. In some implementations, the input device and the output device may be the same device, for example, in the case of a touchscreen.

The environment transducer devices convert one form of energy or signal into another for input into or output from the computing system 500 via the I/O port 508. For example, an electrical signal generated within the computing system 500 may be converted to another type of signal, and/or vice-versa. In one implementation, the environment transducer devices sense characteristics or aspects of an environment local to or remote from the computing device 500, such as, light, sound, temperature, pressure, magnetic field, electric field, chemical properties, physical movement, orientation, acceleration, gravity, and/or the like. Further, the environment transducer devices may generate signals to impose some effect on the environment either local to or remote from the example computing device 500, such as, physical movement of some object (e.g., a mechanical actuator), heating or cooling of a substance, adding a chemical substance, and/or the like.

In one implementation, a communication port 510 is connected to a network by way of which the computer system 500 may receive network data useful in executing the methods and systems set out herein as well as transmitting information and network configuration changes determined thereby. Stated differently, the communication port 510 connects the computer system 500 to one or more communication interface devices configured to transmit and/or receive information between the computing system 500 and other devices by way of one or more wired or wireless communication networks or connections. Examples of such networks or connections include, without limitation, Universal Serial Bus (USB), Ethernet, Wi-Fi, Bluetooth®, Near Field Communication (NFC), Long-Term Evolution (LTE), and so on. One or more such communication interface devices may be utilized via the communication port 510 to communicate one or more other machines, either directly over a point-to-point communication path, over a wide area network (WAN) (e.g., the Internet), over a local area network (LAN), over a cellular (e.g., third generation (3G) or fourth generation (4G) or fifth generation (5G) network), or over another communication means. Further, the communication port 510 may communicate with an antenna or other link for electromagnetic signal transmission and/or reception.

In an example implementation, instructions for determining surfactant impact on reservoir wettability and software and other modules and services may be embodied by instructions stored on the data storage devices 504 and/or the memory devices 506 and executed by the processor 502. The computer system 500 may be integrated with or otherwise form part of the system 100.

The system set forth in FIG. 5 is but one possible example of a computer system that may employ or be configured in accordance with aspects of the present disclosure. It will be appreciated that other non-transitory tangible computer-readable storage media storing computer-executable instructions for implementing the presently disclosed technology on a computing system may be utilized.

In the present disclosure, the methods disclosed (e.g., at FIGS. 2-4) may be implemented as sets of instructions or software readable by a device. Further, it is understood that the specific order or hierarchy of steps in the methods disclosed are instances of example approaches. Based upon design preferences, it is understood that the specific order or hierarchy of steps in the method can be rearranged while remaining within the disclosed subject matter. For instance, any of the steps of methods depicted at FIGS. 2-4 may be omitted, repeated, performed in parallel, performed in a different order, and/or combined with any other of methods depicted at FIGS. 2-4. The accompanying method claims present elements of the various steps in a sample order, and are not necessarily meant to be limited to the specific order.

The described disclosure may be provided as a computer program product, or software, that may include a non-transitory machine-readable medium having stored thereon instructions, which may be used to program a computer system (or other electronic devices) to perform a process according to the present disclosure. A machine-readable medium includes any mechanism for storing information in a form (e.g., software, processing application) readable by a machine (e.g., a computer). The machine-readable medium may include, but is not limited to, magnetic storage medium, optical storage medium; magneto-optical storage medium, read only memory (ROM); random access memory (RAM); erasable programmable memory (e.g., EPROM and EEPROM); flash memory; or other types of medium suitable for storing electronic instructions.

While the present disclosure has been described with reference to various implementations, it will be understood that these implementations are illustrative and that the scope of the present disclosure is not limited to them. Many variations, modifications, additions, and improvements are possible. More generally, embodiments in accordance with the present disclosure have been described in the context of particular implementations. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. A method for determining surfactant impact on reservoir wettability, the method comprising:
    obtaining a sample from a reservoir;
    increasing a temperature and a pressure to generate simulated reservoir conditions;
    obtaining a nuclear magnetic resonance T1 measurement of the sample, the nuclear magnetic resonance T1 measurement being captured under the simulated reservoir conditions;
    obtaining a nuclear magnetic resonance T2 measurement of the sample upon imbibing the sample with surfactant, the nuclear magnetic resonance T2 measurement being captured under the simulated reservoir conditions;
    generating a fluid typing map using the nuclear magnetic resonance T1 measurement and the nuclear magnetic resonance T2 measurement; and
    determining an impact of the surfactant on fluid producibility based on the fluid typing map.

2. The method of claim 1, wherein the surfactant is selected for a reservoir from a plurality of surfactants based on the impact of the surfactant on the fluid producibility.

3. The method of claim 1, wherein the reservoir is an unconventional reservoir.

4. The method of claim 1, wherein the temperature is 250° F. and the pressure is 5000 psi.

5. The method of claim 1, wherein the sample is aged for a predetermined period of time at a predetermined temperature following the sample being imbibed with the surfactant and prior to the nuclear magnetic resonance T1 measurement and the nuclear magnetic resonance T2 measurement being obtained.

6. The method of claim 5, wherein the predetermined period of time is two months and the predetermined temperature is 320° F.

7. The method of claim 1, wherein the fluid producibility includes hydrocarbons and water producibility.

8. The method of claim 1, wherein the impact of the surfactant on the fluid producibility is determined based on a differentiation between producible and non-producible hydrocarbon and water as a function of wettability or interfacial tension changes.

9. The method of claim 8, wherein the fluid typing map provides the differentiation between the producible and non-producible hydrocarbon and water.

10. The method of claim 1, wherein the impact of the surfactant on the fluid producibility is determined based on oil production and water cut.

11. The method of claim 1, wherein a concentration of the surfactant is selected based on the impact of the surfactant on the fluid producibility.

12. The method of claim 1, wherein the sample is imbibed with a tracer.

13. The method of claim 12, wherein the tracer has an affinity to water or oil.

14. The method of claim 12, wherein the sample is a first sample and the nuclear magnetic resonance T1 measurement is a first nuclear magnetic resonance T1 measurement, the fluid typing map being generated using a second nuclear magnetic resonance T1 measurement of a second sample obtained simultaneously with the nuclear magnetic resonance T2 measurement.

15. One or more tangible non-transitory computer-readable storage media storing computer-executable instructions for performing a computer process on a computing system, the computer process comprising:
    obtaining a sample from a reservoir formation;
    increasing a temperature and a pressure to generate simulated reservoir conditions;
    obtaining a nuclear magnetic resonance T1 measurement of the sample, the nuclear magnetic resonance T1 measurement being captured under the simulated reservoir conditions;
    obtaining a nuclear magnetic resonance T2 measurement of the sample upon imbibing the sample with surfactant, the nuclear magnetic resonance T2 measurement being captured under the simulated reservoir conditions;
    generating a fluid typing map using the nuclear magnetic resonance T1 measurement and the nuclear magnetic resonance T2 measurement; and
    generating a determination of an impact of the surfactant on fluid producibility based on the fluid typing map.

16. The one or more tangible non-transitory computer-readable storage media of claim 15, wherein the sample is aged for a predetermined period of time at a predetermined temperature following the sample being imbibed with the surfactant and prior to the nuclear magnetic resonance T1 measurement and the nuclear magnetic resonance T2 measurement being obtained.

17. The one or more tangible non-transitory computer-readable storage media of claim 15, wherein a concentration of the surfactant is selected based on the impact of the surfactant on the fluid producibility.

18. A system for determining surfactant impact on reservoir wettability, the system comprising:
    a nuclear magnetic resonance measurement tool configured to capture a nuclear magnetic resonance T1 measurement and a nuclear magnetic resonance T2 measurement of a sample from a reservoir formation, the sample subjected to a temperature and a pressure to create simulated reservoir conditions, the nuclear magnetic resonance T2 measurement of the sample being captured in connection with imbibing the sample with surfactant; and
    a computing device configured to generate a fluid typing map using the nuclear magnetic resonance T1 measurement and the nuclear magnetic resonance T2 measurement, the computing device configured to determining an impact of the surfactant on fluid producibility based on the fluid typing map.

19. The system of claim 18, wherein a concentration of the surfactant is selected based on the impact of the surfactant on the fluid producibility.

* * * * *